(12) United States Patent
Liu et al.

(10) Patent No.: US 8,472,005 B2
(45) Date of Patent: Jun. 25, 2013

(54) METHODOLOGY FOR IMPLEMENTING ENHANCED OPTICAL LITHOGRAPHY FOR HOLE PATTERNING IN SEMICONDUCTOR FABRICATION

(75) Inventors: George Liu, Hsin-Chu (TW); Kuei Shun Chen, Hsin-Chu (TW); Norman Chen, Hsinchu (TW); Vencent Chang, Hsin-Chu (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1063 days.

(21) Appl. No.: 11/677,693

(22) Filed: Feb. 22, 2007

(65) Prior Publication Data

US 2008/0204688 A1    Aug. 28, 2008

(51) Int. Cl.
G03B 27/54    (2006.01)

(52) U.S. Cl.
USPC ............................................... 355/67; 355/53

(58) Field of Classification Search
USPC ........................................................ 355/67, 53
See application file for complete search history.

(56) References Cited

U.S. PATENT DOCUMENTS

| 6,549,266 | B1 * | 4/2003 | Taniguchi | 355/53 |
| 2006/0072095 | A1 * | 4/2006 | Kudo et al. | 355/67 |
| 2007/0008511 | A1 * | 1/2007 | De Boeij et al. | 355/71 |

* cited by examiner

*Primary Examiner* — Hung Henry Nguyen
*Assistant Examiner* — Mesfin T Asfaw
(74) *Attorney, Agent, or Firm* — Haynes and Boone, LLP

(57) ABSTRACT

System and method for enhancing optical lithography methodology for hole patterning in semiconductor fabrication are described. In one embodiment, a photolithography system comprises an illumination system for conditioning light from a light source, the illumination system producing a three-pore illumination pattern; a reticle comprising at least a portion of a pattern to be imaged onto a substrate, wherein the three-pore illumination pattern produced by the illumination system is projected through the reticle; and a projection lens disposed between the reticle and the substrate.

19 Claims, 5 Drawing Sheets

US 8,472,005 B2

METHODOLOGY FOR IMPLEMENTING ENHANCED OPTICAL LITHOGRAPHY FOR HOLE PATTERNING IN SEMICONDUCTOR FABRICATION

BACKGROUND

The fabrication of integrated circuits ("ICs") involves the performance of a range of chemical and physical processes on a semiconductor substrate. In general, these processes include deposition, patterning, and doping. Fundamental to all of these processes is lithography, by which process three-dimensional relief images are formed on a substrate for subsequent transfer of a pattern to the substrate.

Lithography accounts for a large part of the cost of IC fabrication, due to the large number of lithography steps involved in fabrication. In addition, lithography generally presents the primary limitation to further advancements in the reduction of feature size and silicon area and the increase in transistor speed. Clearly, therefore, a balance must be struck between cost and capability when developing a lithography process.

Optical lithography is a well-known photographic process by which a photoresist layer comprising a polymer product deposited on a substrate is exposed (i.e., irradiated with UV light) and developed to form three dimensional relief images on the substrate. In general, the ideal photoresist image has the exact shape of the intended pattern in the plane of the substrate with vertical walls through the thickness of the resist. Thus, the final resist pattern is binary, with parts of the substrate covered with the resist while other parts are uncovered. Although the polymer product itself may be photoactive, generally a photoresist contains one or more photoactive components in addition to the polymer product. Upon exposure, the photoactive component acts to change the physical or chemical characteristics of the photoresist.

As optical lithography is pushed to smaller dimensions, methods of resolution enhancement, such as, for example, illumination modification, are considered necessary.

BRIEF DESCRIPTION OF THE DRAWINGS

The features and advantages of a contrast enhancing exposure system and method for use in semiconductor fabrication in accordance with an embodiment will be more clearly understood from the following description taken in conjunction with the accompanying drawings in which like reference numerals designate similar or corresponding elements, regions, and portions, and in which.

DETAILED DESCRIPTION

Figure 1A:
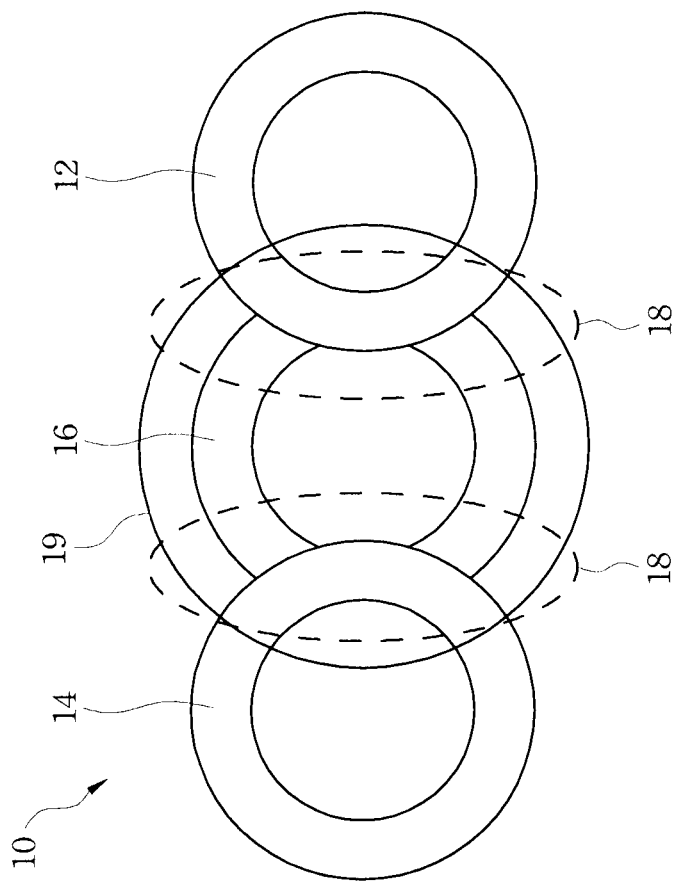
FIGS. 1A-1C illustrate diffraction patterns resulting from use of masks corresponding to patterns each having a different pitch.
Figure 1B:
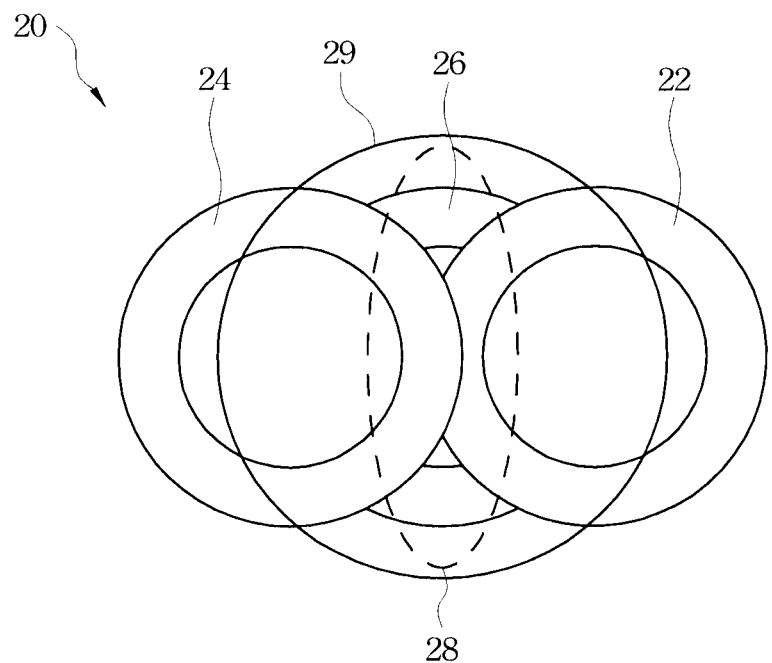
Figure 1C:
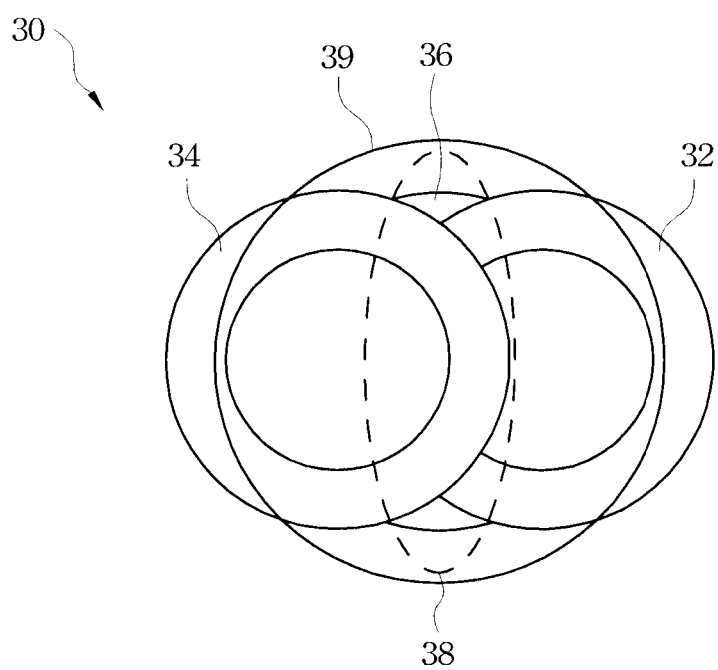

FIGS. 1A-1C each illustrates a diffraction pattern resulting from exposure of a substrate to a light source via a mask corresponding to a pattern having a particular pitch. In particular, FIG. 1A illustrates a diffraction pattern 10 resulting from exposure of a substrate through a mask having a dense pitch (e.g., 220 nm). As shown in FIG. 1A,—$1^{st}$ order diffraction is represented by an area 12, $1^{st}$ order diffraction is represented by an area 14, and zero order diffraction is represented by an area 16. An area of contrast useful information, which is defined as intensity adequate to provide sufficient contrast, is designated by ellipses 18a, 18b, located near opposite edges of a numerical aperture ("NA") 19 of a lens. FIG. 1B illustrates a diffraction pattern 20 resulting from exposure of a substrate through a mask having a semi-dense pitch (e.g., 360 nm). As shown in FIG. 1B,—$1^{st}$ order diffraction is represented by an area 22, $1^{st}$ order diffraction is represented by an area 24, and zero order diffraction is represented by an area 26. An area of contrast useful information is designated by an ellipse 28 located at the center of an NA 29 of a lens. FIG. 1C illustrates a diffraction pattern 30 resulting from exposure of a substrate through a mask having an isolated pitch (e.g., 600 nm). As shown in FIG. 1C,—$1^{st}$ order diffraction is represented by an area 32, $1^{st}$ order diffraction is represented by an area 34, and zero order diffraction is represented by an area 36. An area of contrast useful information is designated by an ellipse 38 located at the center of an NA 39 of a lens.

Assuming that all of the lens NAs 19, 29, and 39 are identical, a comparison of FIGS. 1A, 1B, and 1C evinces the fact that, as the pitch decreases (i.e., grows more dense), the $1^{st}$ order diffraction patterns (both positive and negative) migrate toward the edge of the lens NA. In contrast, as the pitch decreases (i.e., grows less dense), the positive and negative $1^{st}$ order diffraction patterns migrate toward, and ultimately merge in, the center of the lens NA. It will be recognized that increasing the amount of $1^{st}$ order diffraction energy that is collected results in better contrast resolution at the photoresist.

Figure 2:
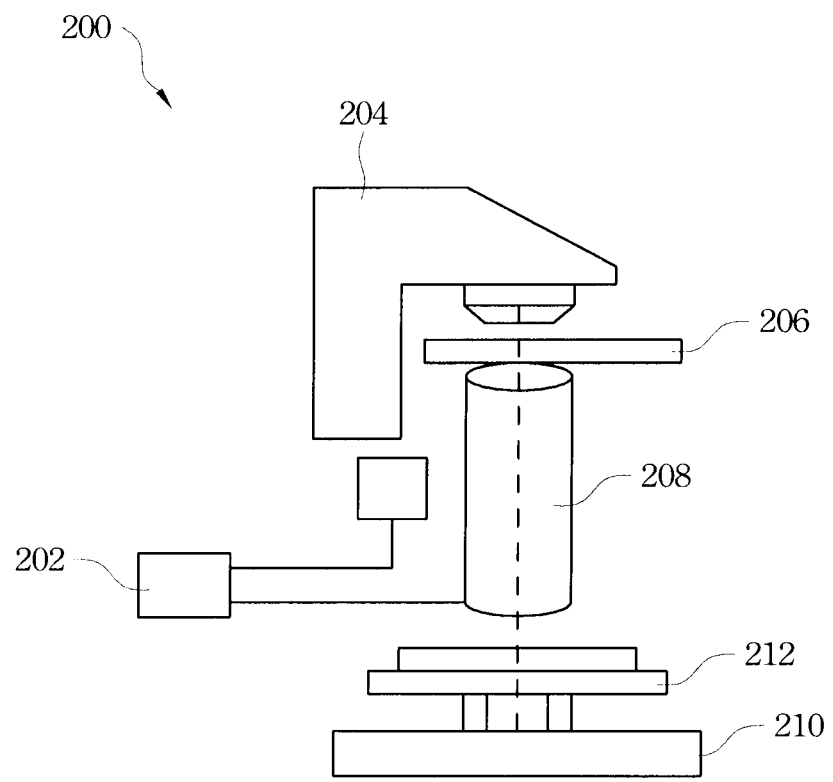
FIG. 2 is a simplified diagram of a photolithography system in which an embodiment may be implemented.

FIG. 2 is a simplified diagram of a photolithography system 200 in which one or more of the embodiments may be implemented. As shown in FIG. 2, the system 200 includes a laser source 202, an illumination system 204, a reticle, or mask, 206, a projection lens 208, and a wafer stage 210 on which a wafer, or substrate, 212 to be imaged is supported. In one embodiment, the illumination system 204 includes components suitable for shaping and conditioning the ultraviolet ("UV") light from the laser source 202 before it is shone through the reticle 206, which contains a pattern to be imaged onto the wafer 212. Components of the illumination system 204 may include, for example, an optical integrator and a condenser lens. It will be understood that the system 200 is provided for purposes of example only and is not intended to limit application of the embodiments described herein to identical or similar systems.

Figure 3:
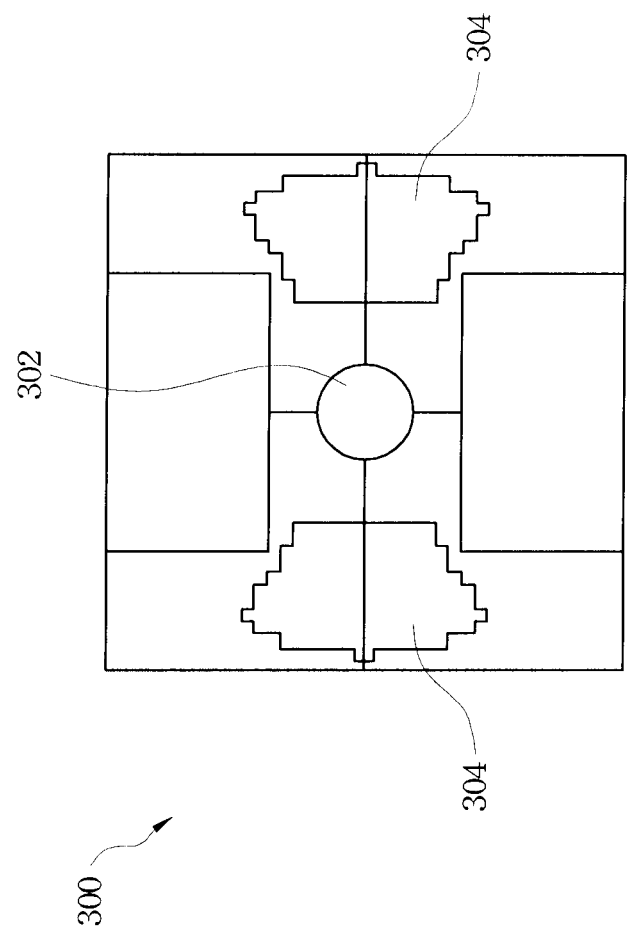
FIG. 3 illustrates a three pore illumination pattern for implementing a three-pore illumination technique of one embodiment.

In one embodiment, the illumination system 204 shapes the UV light to improve the dense pattern contrast and reduce proximity effect. In particular, the system 204 utilizes a three-pore illumination shaper to accomplish this result. The three-pore illumination shaper is illustrated in FIG. 3 and designated by a reference numeral 300. As shown in FIG. 3, the shaper 300 includes three pores 302, 304, and 304. The shaper 300 enables isolated feature contrast to be obtained via the central pore 302, while the pores 304, which together comprise dipole illumination, improve dense pitch contrast by increasing the amount of first order diffraction energy that will be captured.

Figure 4:
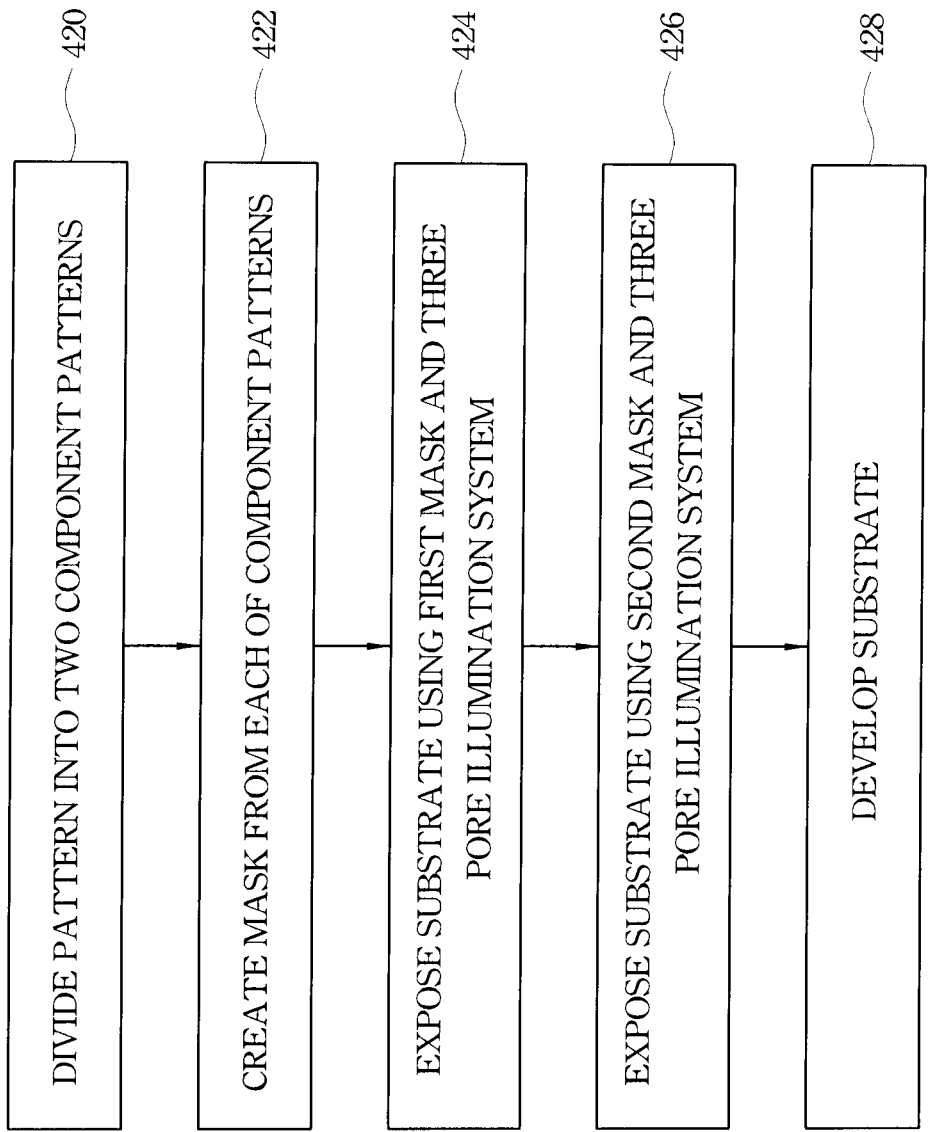
FIG. 4 illustrates a flowchart of a method for implementing a three-pore illumination technique in accordance with one embodiment for improving dense orientation pattern contrast.

FIG. 4 is a flowchart illustrating a method of performing a contrast enhancing exposure method according to one embodiment. In step 400, a pattern to be formed on a substrate is divided into two component patterns. Details regarding the manner in which this step may be accomplished are provided in U.S. patent application Ser. No. 11/677,879, entitled "Contrast Enhancing Exposure System and Method for use in Semiconductor Fabrication," which is assigned to the assignee of the present application and hereby incorporated by reference in its entirety. As indicated in that disclosure, division of a pattern into two component patterns may be performed in a number of manners; however, the guiding principle to be used in determining how to divide the pattern is that the goal is to maximize the pitch (i.e., hole plus space) in one direction (i.e., x or y direction) across the pattern. In step 422, a mask is created from each of the component patterns. In step 424, a photoresist layer of a substrate, or wafer, on which the pattern is to be formed is exposed using a first one of the masks using a system, such as the system 200 (FIG. 2) that employs an embodiment of the three-pore illumination technique described herein. In step 426, the photoresist layer is exposed to the second one of the masks using a system, such as the system 200 (FIG. 2) that employs an embodiment of the three-pore illumination technique described herein. In step 428, the substrate is developed, at which point other process steps (e.g., etching, implantation, resist stripping) are performed as necessary to complete the fabrication process.

It will be recognized that it is not necessary to divide the pattern into two component patterns; however, doing so enables improved contrast information to be captured in both x- and y-directions. Specifically, the split pattern may be used to increase contrast in a first direction (e.g., the x-direction), while the three-pore illumination technique is employed simultaneously to increase contrast in the other direction (e.g., the y-direction).

One embodiment is a photolithography apparatus comprising an illumination system for conditioning light from a light source, the illumination system producing a three-pore illumination pattern; a reticle comprising at least a portion of a pattern to be imaged onto a substrate, wherein the three-pore illumination pattern produced by the illumination system is projected through the reticle; and a projection lens disposed between the reticle and the substrate.

Another embodiment comprises a photolithography apparatus comprising means for providing ultra-violet ("UV") light; means for conditioning light the UV light and producing a three-pore illumination pattern; reticle means comprising at least a portion of a pattern to be imaged onto a substrate, wherein the three-pore illumination pattern is projected through the reticle means; and lens means disposed between the reticle and the substrate.

Yet another embodiment is a method of forming a pattern on a substrate. The method comprises conditioning light from an ultraviolet light source to produce a three-pore illumination pattern; and projecting the three-pore illumination pattern onto a substrate via a reticle comprising at least a portion of a pattern to be imaged on the substrate.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A photolithography apparatus comprising:
   an illumination system for conditioning radiation from a light source, the illumination system comprising a three-pore illumination shaper, wherein at least one of the three pores is defined by a first edge of the shaper extending along a first axis and an opposing second edge of the shaper extending along a second axis, the first edge being connected to the second edge by a first plurality of edges of the shaper extending along the first axis and a second plurality of edges of the shaper extending along the second axis, the first axis being substantially perpendicular to the second axis;
   a reticle comprising at least a portion of a pattern to be imaged onto a substrate, wherein a three-pore illumination pattern provided by the illumination system is projected through the reticle; and
   a projection lens disposed between the reticle and the substrate.

2. The apparatus of claim 1 wherein the illumination system further comprises an optical integrator and a condenser lens.

3. The apparatus of claim 1 wherein the light source comprises a laser.

4. The apparatus of claim 1 wherein the three-pore illumination shaper forms a pattern to be imaged on the substrate that includes a high-density pattern.

5. The apparatus of claim 1 wherein the three pores includes a central pore for facilitating capture of isolated features of the pattern to be imaged on the substrate.

6. The apparatus of claim 5 wherein the three pores includes a pair of pores disposed on opposite sides of the central pore for facilitating capture of dense pitch features of the pattern to be imaged on the substrate.

7. The apparatus of claim 6 wherein the pair of pores are positioned so as to maximize the first order diffraction energy captured during exposure.

8. The method of claim 1 wherein the UV light source comprises a laser.

9. A method of forming a pattern on a substrate, the method comprising:
   shaping radiation from an ultraviolet light source to provide a three-pore illumination pattern; and
   projecting the three-pore illumination pattern onto a substrate via a reticle comprising at least a portion of a pattern to be imaged on the substrate,
   wherein shaping radiation from the ultraviolet light source to provide the three-pore illumination pattern includes using a three-pore illumination shaper, and
   wherein at least one of the three pores is defined by a first edge of the shaper extending along a first axis and an opposing second edge of the shaper extending along a second axis, the first edge being connected to the second edge by a first plurality of edges of the shaper extending along the first axis and a second plurality of edges of the shaper extending along the second axis, the first axis being substantially perpendicular to the second axis.

10. The method of claim 9 wherein the pattern to be imaged on the substrate comprises a high-density pattern.

11. The method of claim 9 wherein the three-pore illumination pattern comprises a central pore for facilitating capture of isolated features of the pattern to be imaged on the substrate.

12. The method of claim 11 wherein the three-pore illumination pattern comprises a pair of pores disposed on opposite sides of the central pore for facilitating capture of dense pitch features of the pattern to be imaged on the substrate.

13. The method of claim 12 wherein the pair of pores are positioned so as to maximize the first order diffraction energy captured during exposure of the substrate.

14. A photolithography apparatus comprising:
   a mechanism for securing a substrate;
   a radiation source;

a mechanism for securing a reticle including a pattern;
a projection lens disposed between the reticle and the substrate; and
a multi-pore illumination device disposed between the radiation source and the substrate, wherein a first pore of the multi-pore illumination device enhances contrast of an isolated feature of the pattern, and a second pore of the multi-pore illumination device enhances contrast of a dense feature of the pattern, the second pore defined by a first edge of the multi-pore illumination device extending along a first axis and an opposing second edge of the multi-pore illumination device extending along a second axis, the first edge being connected to the second edge by a first plurality of edges of the multi-pore illumination device extending along the first axis and a second plurality of edges of the multi-pore illumination device extending along the second axis, the first axis being substantially perpendicular to the second axis.

15. The apparatus of claim 14 wherein the multi-pore illumination device is a three-pore shaper and the first pore is centrally located relative to the other two pores.

16. The apparatus of claim 14 wherein the second pore works with a third pore of the three-pore shaper to enhance contrast of the dense feature and wherein the second and third pores are arranged on opposite sides of the first pore.

17. The apparatus of claim 16 wherein the second and third pores are positioned so as to maximize the first order diffraction energy captured during exposure.

18. The apparatus of claim 14 wherein the radiation source comprises a UV radiation source.

19. The apparatus of claim 14 wherein the radiation source comprises a laser.

* * * * *